(12) United States Patent
Wu et al.

(10) Patent No.: US 10,574,230 B1
(45) Date of Patent: Feb. 25, 2020

(54) POWER SWITCH CIRCUIT

(71) Applicant: ANPEC ELECTRONICS CORPORATION, Hsinchu (TW)

(72) Inventors: Tsung-Yu Wu, Hsinchu (TW); Chih-Yuan Chen, Hsinchu (TW); Yu-Yu Chen, Yunlin County (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/278,797

(22) Filed: Feb. 19, 2019

(30) Foreign Application Priority Data

Nov. 9, 2018 (TW) ............................. 107139864 A

(51) Int. Cl.
  *H03K 17/082* (2006.01)
  *H03K 17/68* (2006.01)
  *H02M 3/07* (2006.01)
  *H03K 17/66* (2006.01)
  *H03K 17/72* (2006.01)
(52) U.S. Cl.
  CPC ............ *H03K 17/666* (2013.01); *H02M 3/07* (2013.01); *H03K 17/72* (2013.01)

(58) Field of Classification Search
  CPC combination set(s) only.
  See application file for complete search history.

(56) References Cited

U.S. PATENT DOCUMENTS 5,680,300 A * 10/1997 Szepesi .................. H02M 3/07
                                                                  363/59
2019/0036521 A1 * 1/2019 Wu .................... H03K 17/0822

* cited by examiner

*Primary Examiner* — An T Luu
(74) *Attorney, Agent, or Firm* — Li & Cai Intellectual Property (USA) Office

(57) ABSTRACT

A power switch circuit includes a first switch circuit, a second switch unit and a capacitor. The capacitor has a first terminal coupled to a node between the first and second switch units. In addition, the capacitor has a second terminal coupled to the first and second switch units, a charge pump and a charging circuit. When the power switch circuit is coupled to a load, the charging circuit pre-charges the capacitor. Once the load is enabled, the first and second switch units are turned on by only a small voltage increase at the second terminal of the capacitor by the charge pump to allow power to be supplied to a load through the first and second switch units from a power supply.

12 Claims, 4 Drawing Sheets

POWER SWITCH CIRCUIT

CROSS-REFERENCE TO RELATED PATENT APPLICATION

This application claims the benefit of priority to Taiwan Patent Application No. 107139864, filed on Nov. 9, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power switch circuit, and more particularly to a power switch circuit with a faster response time.

BACKGROUND OF THE DISCLOSURE

The main function of a common power switch circuit is to send power supplied by a power supply to a load. At the moment that the load is enabled, an electrical conduction path between the load and the power supply must be formed in the power switch circuit so the load can receive the power from the power supply. During the operation of the load, if an abnormal condition (for example, an excessive current consumption is caused by the load, or an overcurrent is supplied from the power supply) occurs, the power switch circuit needs to form an open circuit immediately to protect the load and itself. Therefore, a reaction time of the power switch circuit is very important.

SUMMARY OF THE DISCLOSURE

In response to the above-referenced technical inadequacies, the present disclosure provides a power switch circuit with a faster response time. The power switch circuit has an input terminal and an output terminal. The input terminal of the power switch circuit is configured to receive power from a power supply. The output terminal of the power switch circuit is coupled to a load. The power switch circuit includes a switch circuit and a capacitor. The switch circuit is coupled between the input terminal of the power switch circuit and the output terminal of the power switch circuit. The switch circuit includes a first switch unit and a second switch unit which are coupled to a charge pump. The capacitor has a first terminal coupled to a node between the first switch unit and the second switch unit, and a second terminal coupled to the first switch unit, the second switch unit, the charge pump and a charging circuit. When the output terminal of the power switch circuit is coupled to the load and the load is not enabled, the charging circuit pre-charges the capacitor to have a first voltage. When the load is enabled, the charge pump charges the capacitor from the first voltage to a second voltage that is sufficient to turn on the first switch unit and the second switch unit and to allow the power to be sent to the load from the power supply.

In one embodiment of the present disclosure, the first switch unit includes a first transistor and a first bidirectional switch. The first bidirectional switch is connected in parallel to the capacitor and coupled to a control terminal of the first transistor. A first terminal of the first transistor is coupled to the input terminal of the power switch circuit. A second terminal of the first transistor is coupled to the first bidirectional switch and the first terminal of the capacitor. The second switch unit includes a second transistor and a second bidirectional switch. The second bidirectional switch is connected in parallel to the capacitor and coupled to a control terminal of the second transistor. A first terminal of the second transistor is coupled to the second bidirectional switch and the first terminal of the capacitor. A second terminal of the second transistor is coupled to the output terminal of the power switch circuit.

When the load is enabled, the first bidirectional switch is controlled to form an electrical conduction path between the control terminal of the first transistor and the first terminal of the capacitor, and the second bidirectional switch is controlled to form an electrical conduction path between the control terminal of the second transistor and the first terminal of the capacitor. As a result, a voltage at the control terminal of the first transistor and a voltage at the control terminal of the second transistor are equal to the second voltage that is sufficient to turn on the first transistor and the second transistor and to allow the power to be sent to the load from the power supply.

In other embodiments of the present disclosure, the power switch circuit may further include a plurality of protection circuits such as a reverse current blocking circuit, a current limiting circuit or an overcurrent protection circuit, and the like. The first bidirectional switch of the first switching unit may be controlled according to the control signals outputted from the protection circuits to form an electrical conduction path between the control terminal of the first transistor and the second terminal of the capacitor, so as to turn off the first transistor. Alternatively or additionally, the second bidirectional switch of the second switching unit may be controlled according to the control signals outputted from the protection circuits to form an electrical conduction path between the control terminal of the second transistor and the second terminal of the capacitor, so as to turn off the second transistor. Therefore, the present disclosure can achieve different circuit protection purposes, such as blocking reverse current and avoiding the circuit from being damaged by an excessive current.

As described above, a main feature of the power switch circuit of the present disclosure is that it includes the aforementioned capacitor, and when the load is not enabled, the capacitor is charged. As a result, when the load is enabled and during the load operation, only the first bidirectional switch and the second bidirectional switch are controlled such that the first switch unit and the second switch unit can be quickly turned on or turned off. Therefore, the power switch circuit of the present disclosure has a faster response time than that of a common power switch circuit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
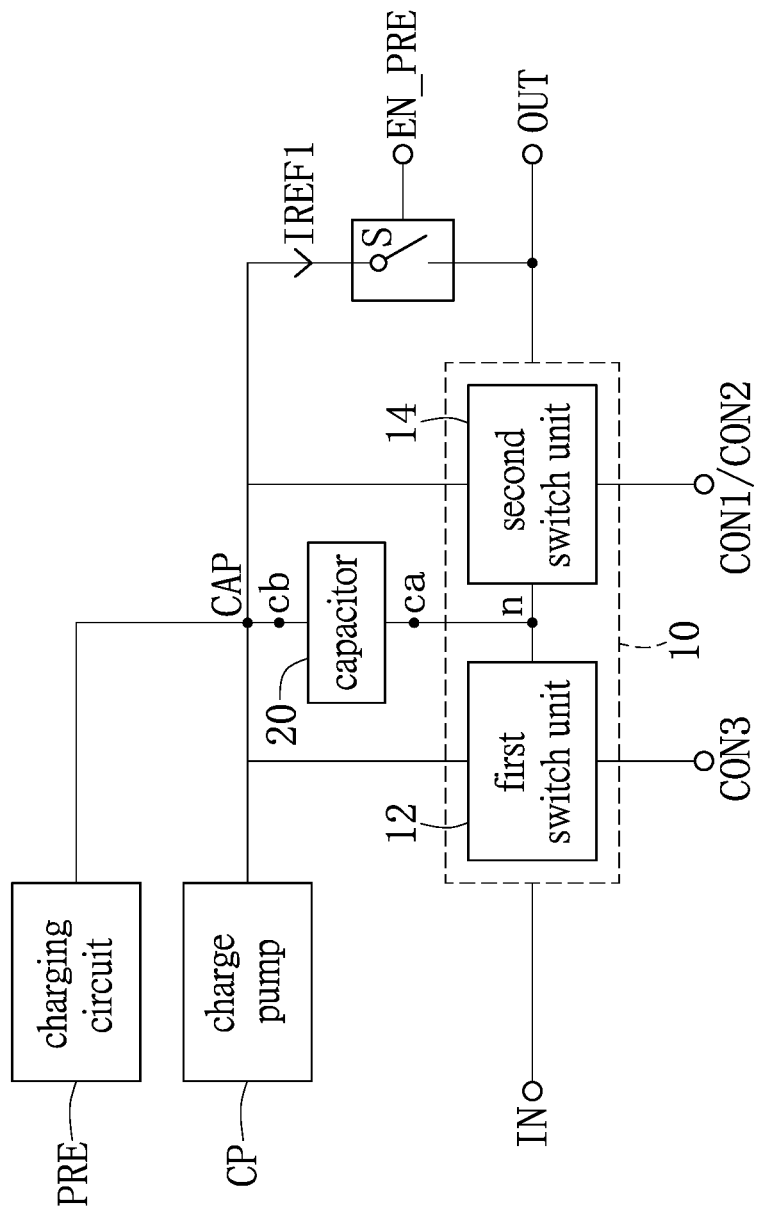
FIG. 1 is a block diagram of a power switch circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a power switch circuit according to an embodiment of the present disclosure.

As shown in FIG. 1, the power switch circuit has an input terminal IN and an output terminal OUT. The input terminal IN of the power switch circuit is configured to receive power from a power supply. The output terminal OUT of the power switch circuit is coupled to a load in the embodiment, but the present invention is not limited thereto, in practice, it may be coupled to other chips having various functions. For example, the load may include a variety of functional chips, and the present disclosure is not limited thereto.

The power switch circuit mainly includes a switch circuit 10 and a capacitor 20. The switch circuit 10 is coupled between the input terminal IN and the output terminal OUT of the power switch circuit. The switch circuit 10 includes a first switch unit 12 and a second switch unit 14. The first switch unit 12 and the second switch unit 14 are both coupled to a charge pump CP and a charging circuit PRE.

It is worth noting that the power switch circuit is characterized in that it includes the capacitor 20. A first terminal ca of the capacitor 20 is coupled to a node n between the first switch unit 12 and the second switch unit 14. A second terminal cb of the capacitor 20 is coupled to the first switch unit 12, the second switch unit 14, the charge pump CP, and the charging circuit PRE. The configuration of the capacitor 20 increases the operating speed of the power switch circuit in many aspects.

Figure 2:
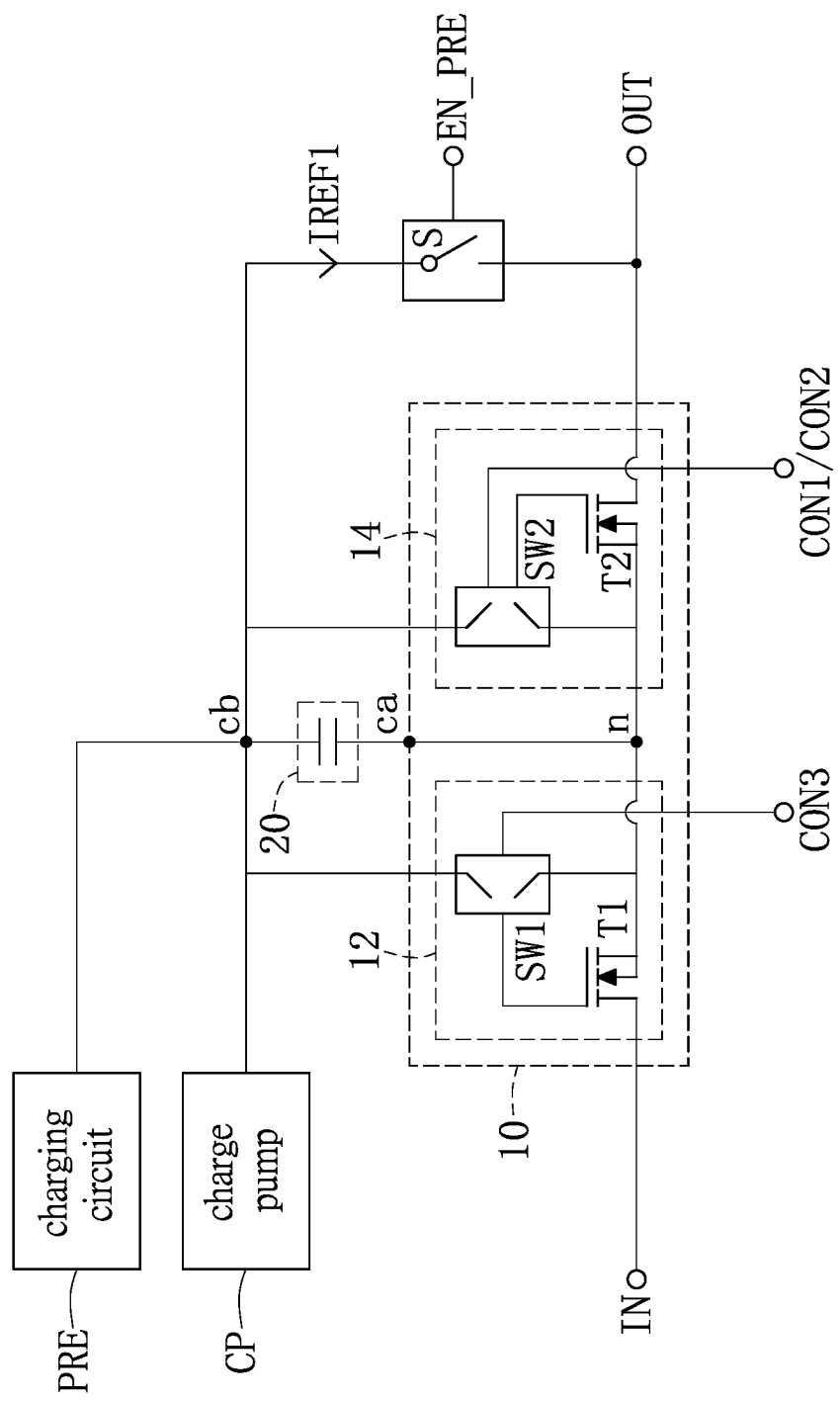
FIG. 2 is a circuit diagram of the power switch circuit of FIG. 1.

Reference is made to FIG. 2, which is a circuit diagram of the power switch circuit of FIG. 1.

As shown in FIG. 2, the first switch unit 12 includes a first transistor T1 and a first bidirectional switch SW1. The first bidirectional switch SW1 is connected in parallel to the capacitor 20 and coupled to a control terminal of the first transistor T1. A first terminal of the first transistor T1 such as a drain of the first transistor T1 as shown in FIG. 2 is coupled to the input terminal IN of the power switch circuit. A second terminal of the first transistor T1 such as a source of the first transistor T1 as shown in FIG. 2 is coupled to the first bidirectional switch SW1 and the first terminal ca of the capacitor 20 that is the node n.

The second switch unit 14 includes a second transistor T2 and a second bidirectional switch SW2. The second bidirectional switch SW2 is connected in parallel to the capacitor 20 and coupled to the control terminal of the second transistor T2. A first terminal of the second transistor T2 such as a source of the second transistor T2 as shown in FIG. 2 is coupled to the second bidirectional switch SW2 and the first terminal ca of the capacitor 20 that is the node n. A second terminal of the second transistor T2 such as a drain of the second transistor T2 as shown in FIG. 2 is coupled to the output terminal OUT of the power switch circuit.

As shown in FIGS. 1 and 2, a current source for supplying a reference current IREF1 is connected to the output terminal OUT of the power switch circuit through a switch S and connected to the load through the output terminal OUT. The switch S is turned on or tuned off based on an enable signal EN_PRE. Before the load and the power switch circuit are started, a voltage at the first terminal ca of the capacitor 20 is the same as a voltage at the second terminal cb of the capacitor 20, that is, a voltage across the capacitor 20 is zero.

First, before the load is started, a system terminal provides the enable signal EN_PRE for turning on the switch S to allow the reference current IREF1 to flow through the switch S to the output terminal OUT to check an electrical conduction path is formed between the power switch circuit and the load. If there is no short circuit formed in wires, the reference current IREF1 may be allowed to flow from the output terminal OUT to the load, and either or both of the charging circuit PRE and the charge pump CP of the power switch circuit may be started to simultaneously or sequentially pre-charges the capacitor 20 such that a first voltage is at a node CAP.

As described above, in the embodiment, the power switch circuit includes the capacitor 20, the charging circuit PRE and the charge pump CP. Further, a voltage at the node CAP has been charged to the first voltage by the charging circuit PRE and the charge pump CP before starting the load. Therefore, when the load is charged by the reference current IREF1 such that a voltage of the load reaches a voltage threshold to start the load, the charge pump CP only needs to increase the voltage at the node CAP from the first voltage to a second voltage.

If the capacitor 20 is not provided (and the charging circuit PRE is not provided) in the power switch circuit, the charge pump CP needs to increase a voltage at the node CAP from zero to the second voltage that is sufficient to turn on the first transistor T1 and the second transistor T2 when the load is enabled.

In contrast, in the embodiment, a time required for the charge pump CP to increase the voltage at the node CAP from the first voltage to the second voltage is shorter than a time required for the charge pump CP to increase the voltage of the node CAP from zero to the second voltage. Therefore, in the embodiment, the capacitor 20 is configured to enable the first switch unit 12 and the second switch unit 14 to be quickly turned on when the load is enabled, and improves an operating speed of the power switch circuit during the process of enabling the load.

Figure 3:
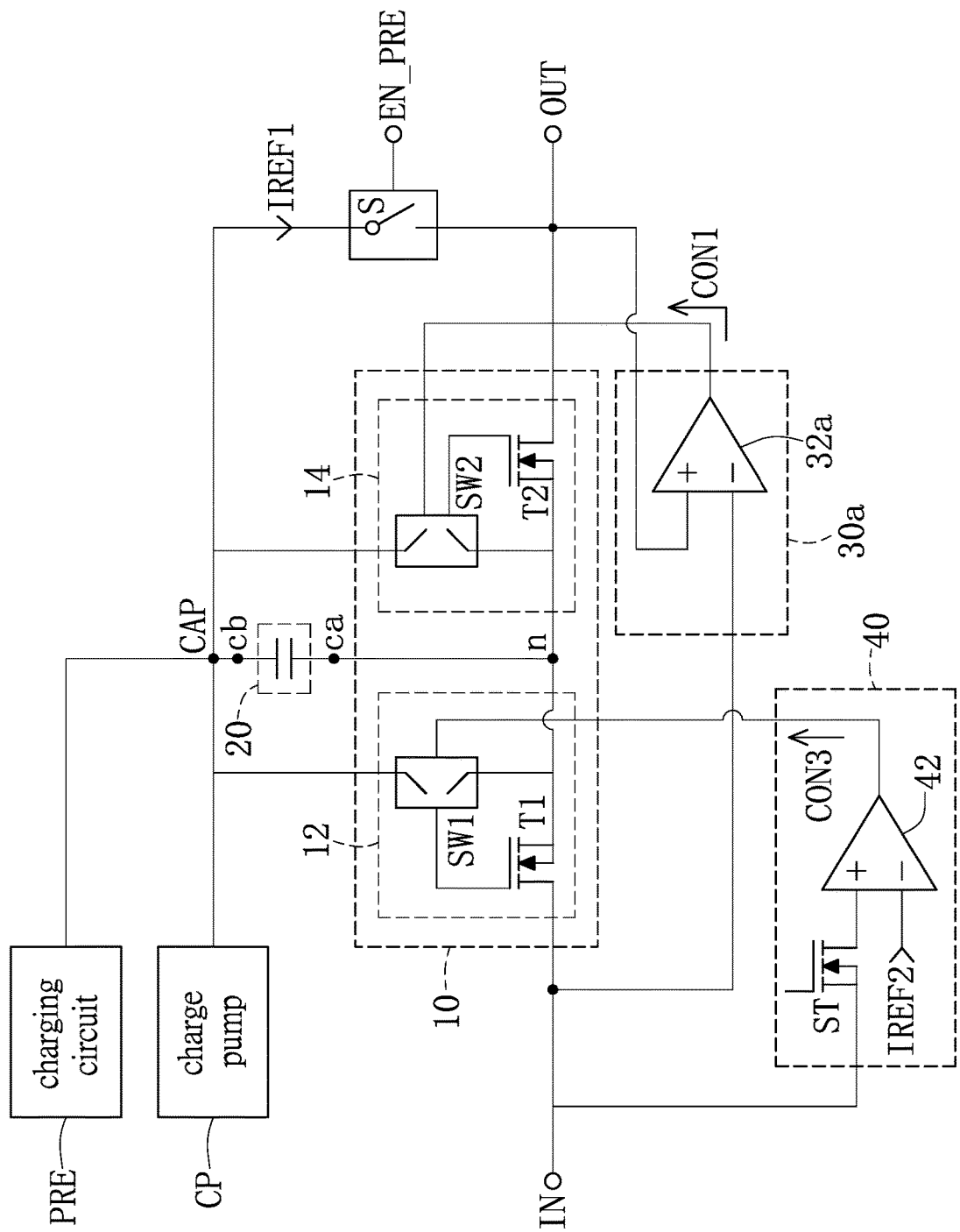
FIG. 3 is a circuit diagram of a power switch circuit according to another embodiment of the present disclosure.

Reference is made to FIG. 3, which is a circuit diagram of a power switch circuit according to another embodiment of the present disclosure.

The power switch circuit of FIG. 3 has a circuit layout and a working principle similar to that of the power switch circuit of FIG. 2. Certain circuit layout differences and working principle differences between the two power switch circuits of FIGS. 2 and 3 will be described below.

One difference between the power switch circuits of FIGS. 2 and 3 is that the power switch circuit of FIG. 3 further includes a first protection circuit 30a. The first protection circuit 30a includes a first operational amplifier 32a. As shown in FIG. 3, an inverting input terminal of the first operational amplifier 32a is coupled to the input terminal IN of the power switch circuit, and a non-inverting input terminal of the first operational amplifier 32a is coupled to the output terminal OUT of the power switch circuit, and an output terminal of the first operational amplifier 32a is coupled to the second bidirectional switch SW2 of the second switch unit 14.

In the embodiment of FIG. 3, the first protection circuit 30a provides a reverse current blocking (RCB) function for circuit protection.

During the operation of the load, the first operational amplifier 32a outputs a first control signal CON1 for controlling the second bidirectional switch SW2 according to a voltage difference between a voltage at the input terminal IN of the power switch circuit and a voltage at the output terminal OUT of the power switch circuit.

If a voltage difference between the voltage at the input terminal IN of the power switch circuit and the voltage at the output terminal OUT of the power switch circuit is smaller than or equal to a first predetermined voltage difference (or, approaching zero), it means no reverse current flows back to the power supply from the load. In response to this condition, the first operational amplifier 32a outputs the first control signal CON1 for controlling the second bidirectional switch SW2 to allow an electrical conduction path to be formed between the control terminal of the second transistor T2 and the first terminal ca of the capacitor 20 that is the node n. As a result, an electrical conduction path is formed between a supply source connected to the input terminal IN and the load connected to the output terminal OUT.

Conversely, if the voltage difference between the voltage at the input terminal IN of the power switch circuit and the voltage at the output terminal OUT of the power switch circuit is greater than the first predetermined voltage difference, it means that a reverse current flows back to the power supply from the load. In response to this condition, the first operational amplifier 32a outputs the first control signal CON1 for controlling the second bidirectional switch SW2 to form an electrical conduction path between the control terminal of the second transistor T2 and the second terminal cb of the capacitor 20, instead of forming the electrical conduction path between the control terminal of the second transistor T2 and the first terminal ca of the capacitor 20. At this time, the second transistor T2 is turned off. Therefore, an open circuit is formed between the load and the power supply to prevent a reverse current from flowing back to the power supply from the load.

Furthermore, another difference between the power switch circuits of FIGS. 2 and 3 is that the power switch circuit of FIG. 3 further includes a third protection circuit 40. As shown in FIG. 3, the third protection circuit 40 includes a sensing transistor ST and a comparator 42. An inverting input terminal of the comparator 42 receives a threshold current IREF2. A non-inverting input terminal of the comparator 42 is coupled to the input terminal IN of the power switch circuit through the sensing transistor ST. An output terminal of the comparator 42 is coupled to the first bidirectional switch SW1 of the first switch unit 12.

The third protection circuit 40 can provide various circuit protection functions based on different circuit designs in actual operations, such as a current limiting (CL) function or an over current protection (OCP) function as shown in FIG. 3.

During the operation of the load, the comparator 42 may obtain a current supplied from the power supply through the sensing transistor ST. The comparator 42 compares the threshold current IREF2 with the current supplied from the power supply, and accordingly outputs a third control signal CON3 for controlling the first bidirectional switch SW1. For example, the threshold current IREF2 may be set according to a safe current of the power switch circuit whose definition is known to one skilled in the art and thus will not be described in detail herein.

If the current supplied from the power supply is smaller than or equal to the threshold current IREF2, depending on a definition of the threshold current IREF2, it may be determined that the current supplied from the power supply still falls within the allowable current range of the power switch circuit, or the current supplied from the power supply does not damage the load. At this time, the comparator 42 outputs a third control signal CON3 for controlling the first bidirectional switch SW1 such that an electrical conduction path is formed between the control terminal of the first transistor T1 and the first terminal ca of the capacitor 20 that is the node n. As a result, the electrical conduction path is formed between the supply source connected to the input terminal IN and the load connected to the output terminal OUT.

Conversely, if the current supplied from the power supply is larger than the threshold current IREF2, depending on the definition of the threshold current IREF2, it may be determined that the current supplied from the power supply exceeds the allowable current range of the power switch circuit, or the load may be damaged by the current supplied from the power supply. In this condition, the comparator 42 outputs the third control signal CON3 for controlling the first bidirectional switch SW1 such that an electrical conduction path is formed between the control terminal of the first transistor T1 and the second terminal cb of the capacitor 20. At this time, the second transistor T2 is turned off. Therefore, the open circuit is formed between the load and the power supply to prevent the power switch circuit or the load from being damaged due to an excessive current passing through them.

Figure 4:
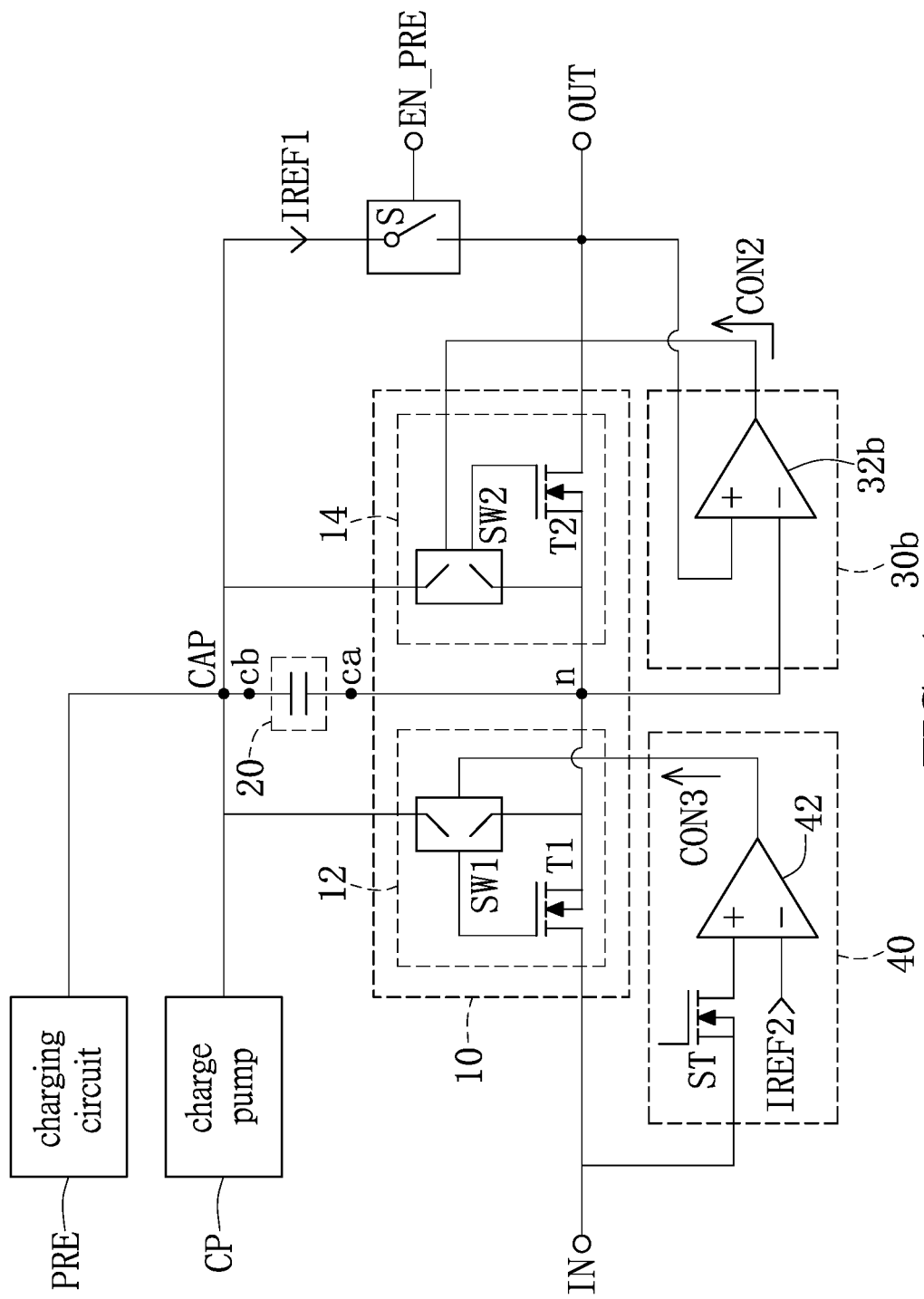
FIG. 4 is a circuit diagram of a power switch circuit of yet another embodiment of the present disclosure.

It should be noted that, in this condition, the power switch circuit cannot obtain the power from the power supply. Accordingly, the second transistor T2 of the second switch unit 14 is turned off. Reference is made to FIG. 4, which is a circuit diagram of a power switch circuit of yet another embodiment of the present disclosure.

The power switch circuit of FIG. 3 has a circuit layout and a working principle similar to that of the power switch circuit of FIG. 4. Certain circuit layout differences and working principle differences between the two power switch circuits of FIGS. 3 and 4 will be described below.

One difference between the two power switch circuits of FIGS. 3 and 4 is that a second protection circuit 30b, rather than the first protection circuit 30a, is disposed in the power switch circuit of FIG. 4. The second protection circuit 30b includes a second operational amplifier 32b. As shown in FIG. 4, an inverting input terminal of the second operational amplifier 32b is coupled to the first terminal ca of the capacitor 20. A non-inverting input terminal of the second operational amplifier 32b is coupled to the output terminal OUT of the power switch circuit. An output terminal of the second operational amplifier 32b is coupled to the second bidirectional switch SW2 of the second switch unit 14.

The second protection circuit 30b shown in FIG. 4 can provide a RCB function for circuit protection as the first protection circuit 30a shown in FIG. 3.

The second operational amplifier 32b outputs a second control signal CON2 for controlling the second bidirectional switch SW2 during the operation of the load, according to a voltage difference between a voltage at the first terminal ca of the capacitor 20 (that is a voltage at the node n) and a voltage at the output terminal OUT of the power switch circuit.

If the voltage difference between the voltage at the node n and the voltage at the output terminal OUT of the power switch circuit is smaller than or equal to a second predetermined voltage difference (or, approaching zero), it means no reverse current flows back to the power supply from the load. In this condition, the second operational amplifier 32b outputs the second control signal CON2 for controlling the second bidirectional switch SW2 to form an electrical conduction path between the control terminal of the second transistor T2 and the first terminal ca of the capacitor 20 that is the node n. As a result, the electrical conduction path is formed between the supply source connected to the input terminal IN and the load connected to the output terminal OUT.

Conversely, if the voltage difference between the voltage at the node nc and the voltage at the output terminal OUT of the power switch circuit is greater than the second predetermined voltage difference, it means that a reverse current flows back to the power supply from the load. In this condition, the second operational amplifier 32b outputs the second control signal CON2 for controlling the second bidirectional switch SW2 to form an electrical conduction path formed between the control terminal of the second transistor T2 and the second terminal cb of the capacitor 20. As a result, the open circuit is formed between the supply source and the load. Therefore, the reverse current is prevented from flowing back to the power supply from the load That is, another difference between the two power switch circuits of FIGS. 3 and 4 is that the inverting input terminal of the first operational amplifier 32a in the power switch circuit of FIG. 3 is coupled to the input terminal IN of the power switch circuit, while the inverting input terminal of the second operational amplifier 32b in the power switch circuit of FIG. 4 is coupled to the first terminal ca of the capacitor 20 that is the node n.

In short, in the power switch circuit shown in FIG. 3, the first operational amplifier 32a outputs the first control signal CON1 for preventing a reverse current from flowing back to the power supply from the load according to the voltage difference between the voltage at the input terminal IN of the power switch circuit and the voltage at the output terminal OUT of the power switch circuit. In the power switch circuit shown in FIG. 4, the second operational amplifier 32b outputs the second control signal CON2 for preventing a reverse current from flowing back to the power supply from the load according to the voltage difference between the voltage at the first terminal ca of the capacitor 20 (that is, the voltage at the node n) and the voltage at the output terminal OUT of the power switch circuit.

To sum up, the power switch circuit is characterized in that it includes the aforementioned capacitor. When the load is not enabled, the capacitor is pre-charged. As a result, when the load is enabled, the charge pump only needs to cause small increase in the voltage at the second terminal of the capacitor for quickly turning on the first switch unit and the second switch unit, so that the power is supplied to the load from the power supply. Moreover, during the operation of the load, the reverse current can be prevented from flowing back to the supply source from the load.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power switch circuit having an input terminal and an output terminal, wherein the input terminal of the power switch circuit is configured to receive power from a power supply, the output terminal of the power switch circuit is coupled to a load, the power switch circuit comprising:
    a switch circuit coupled between the input terminal of the power switch circuit and the output terminal of the power switch circuit, the switch circuit including a first switch unit and a second switch unit which are coupled to a charge pump; and
    a capacitor having a first terminal coupled to a node between the first switch unit and the second switch unit, and a second terminal coupled to the first switch unit, the second switch unit, the charge pump and a charging circuit,
    wherein when the output terminal of the power switch circuit is coupled to the load and the load is not enabled, the charging circuit pre-charges the capacitor to have a first voltage; and
    wherein when the load is enabled, the charge pump charges the capacitor from the first voltage to a second voltage that is sufficient to turn on the first switch unit and the second switch unit and to allow the power to be sent to the load from the power supply.

2. The power switch circuit of claim 1, wherein the first switch unit includes a first transistor and a first bidirectional switch, the first bidirectional switch is connected in parallel to the capacitor and coupled to a control terminal of the first transistor, a first terminal of the first transistor is coupled to the input terminal of the power switch circuit, and a second terminal of the first transistor is coupled to the first bidirectional switch and the first terminal of the capacitor; and wherein the second switch unit includes a second transistor and a second bidirectional switch, the second bidirectional switch is connected in parallel to the capacitor and coupled to a control terminal of the second transistor, a first terminal of the second transistor is coupled to the second bidirectional switch and the first terminal of the capacitor, and a second terminal of the second transistor is coupled to the output terminal of the power switch circuit.

3. The power switch circuit of claim 2, wherein when the load is enabled, the first bidirectional switch is controlled to form an electrical conduction path between the control terminal of the first transistor and the second terminal of the capacitor, and the second bidirectional switch is controlled to form an electrical conduction path between the control terminal of the second transistor and the second terminal of the capacitor, so that a voltage at the control terminal of the first transistor and a voltage at the control terminal of the second transistor are equal to the second voltage for turning on the first transistor and the second transistor and sending the power to the load from the power supply.

4. The power switch circuit of claim 3, further comprising a first protection circuit including:
   a first operational amplifier having:
      an inverting input terminal coupled to the input terminal of the power switch circuit;
      a non-inverting input terminal coupled to the output terminal of the power switch circuit; and
      an output terminal coupled to the second bidirectional switch of the second switch unit,
   wherein the first operational amplifier outputs a first control signal for controlling the second bidirectional switch according to a voltage difference between a voltage at the input terminal of the power switch circuit and a voltage at the output terminal of the power switch circuit.

5. The power switch circuit of claim 4, wherein during an operation of the load, when the voltage difference between the voltage at the input terminal of the power switch circuit and the voltage at the output terminal of the power switch circuit is smaller than or equal to a first predetermined voltage difference, the second bidirectional switch is controlled according to the first control signal to form the electrical conduction path between the control terminal of the second transistor and the first terminal of the capacitor, and the second transistor is turned on, and when the voltage difference between the voltage at the input terminal of the power switch circuit and the voltage at the output terminal of the power switch circuit is greater than the first predetermined voltage difference, the second bidirectional switch is controlled according to the first control signal to form an electrical conduction path between the control terminal of the second transistor and the second terminal of the capacitor, and the second transistor is turned off.

6. The power switch circuit of claim 3, further comprising a second protection circuit including:
   a second operational amplifier having:
      an inverting input terminal coupled to the first terminal of the capacitor;
      a non-inverting input terminal coupled to the output terminal of the power switch circuit; and
      an output terminal coupled to the second bidirectional switch of the second switch unit,
   wherein the second operational amplifier outputs a second control signal for controlling the second bidirectional switch according to a voltage difference between a voltage at the first terminal of the capacitor and a voltage at the output terminal of the power switch circuit.

7. The power switch circuit of claim 6, wherein during an operation of the load, when the voltage difference between the voltage at the first terminal of the capacitor and the voltage at the output terminal of the power switch circuit is smaller than or equal to a second predetermined voltage difference, the second bidirectional switch is controlled according to the second control signal to form the electrical conduction path between the control terminal of the second transistor and the first terminal of the capacitor, and the second transistor is turned on, and when the voltage difference between the voltage at the first terminal of the capacitor and the voltage at the output terminal of the power switch circuit is greater than the second predetermined voltage difference, the second bidirectional switch is controlled according to the second control signal to form an electrical conduction path between the control terminal of the second transistor and the second terminal of the capacitor, and the second transistor is turned off.

8. The power switch circuit of claim 3, further comprising a third protection circuit including:
   a sensing transistor; and
   a comparator having:
      an inverting input terminal configured to receive a threshold current;
      a non-inverting input terminal coupled to the input terminal of the power switch circuit through the sensing transistor; and
      an output terminal coupled to the first bidirectional switch of the first switch unit;
   wherein the comparator compares the threshold current with a current supplied from the power supply to output a third control signal for controlling the first bidirectional switch.

9. The power switch circuit of claim 8, wherein during an operation of the load, when the current supplied from the power supply is smaller than or equal to the threshold current, the first bidirectional switch is controlled according to the third control signal to form the electrical conduction path between the control terminal of the first transistor and the first terminal of the capacitor, and the first transistor is turned on, and when the current supplied from the power supply is larger than the threshold current, the first bidirectional switch is controlled according to the third control signal to form an electrical conduction path between the control terminal of the first transistor and the second terminal of the capacitor, and the first transistor is turned off.

10. The power switch circuit of claim 4, wherein the first protection circuit is a reverse current blocking circuit.

11. The power switch circuit of claim 6, wherein the second protection circuit is a reverse current blocking circuit.

12. The power switch circuit of claim 8, wherein the third protection circuit is a current limiting circuit or an overcurrent protection circuit.

* * * * *